United States Patent [19]

Nishizawa

[11] Patent Number: 5,240,685
[45] Date of Patent: Aug. 31, 1993

[54] APPARATUS FOR GROWING A GAAS SINGLE CRYSTAL BY PULLING FROM GAAS MELT

[75] Inventor: Jun-ichi Nishizawa, Sendai, Japan

[73] Assignee: Zaidan Hojin Handotai Kenkyu Shinkokai, Sendai, Japan

[21] Appl. No.: 873,985

[22] Filed: Apr. 27, 1992

Related U.S. Application Data

[60] Continuation of Ser. No. 624,496, Dec. 7, 1990, abandoned, which is a continuation of Ser. No. 288,094, Dec. 22, 1988, abandoned, which is a division of Ser. No. 80,169, Jul. 30, 1987, abandoned, which is a continuation of Ser. No. 780,719, Sep. 27, 1985, abandoned, which is a division of Ser. No. 511,629, Jul. 7, 1983, abandoned.

[30] Foreign Application Priority Data

Jul. 8, 1982 [JP] Japan .................. 57-118916

[51] Int. Cl.$^5$ .................................. C30B 15/20
[52] U.S. Cl. .......................... 422/249; 156/617.1; 156/618.1; 156/620.2; 156/601
[58] Field of Search .................. 422/249, 105; 158/617.1, 618.1, 620.2, 601, 607, DIG. 78, Dig. 115

[56] References Cited

U.S. PATENT DOCUMENTS

| | | |
|---|---|---|
| 3,268,297 | 8/1966 | Fischer .................. 422/249 |
| 3,617,392 | 11/1971 | Locke .................... 422/249 |
| 3,700,412 | 10/1972 | Higashi et al. ............ 422/249 |
| 4,028,058 | 6/1977 | Beinnert et al. ........... 156/620.2 |
| 4,058,429 | 11/1977 | Duncan et al. ............ 156/617.1 |
| 4,190,486 | 2/1980 | Kyle ..................... 156/601 |
| 4,832,922 | 5/1989 | Nishizawa ................ 422/249 |

OTHER PUBLICATIONS

Hanney, "Semiconductor Crystal Growing", Semi-Conductors, Monograph, Series No. 140, 1966 pp. 107-110.

Farges "A Method for the In-Situ Synthesis and Growth of Indium Phosphide in a Czochralski Puller", Journal of Crystal Growth, vol. 59 (1982) 665-668.

Primary Examiner—Robert Kunemund
Attorney, Agent, or Firm—Cushman, Darby & Cushman

[57] ABSTRACT

In an apparatus for growing a GaAs single crystal from its melt, As vapor which is controlled appropriately of its pressure is applied from an As chamber to the surface of the GaAs melt in a vessel throughout the growing process through an As passage communicating between the melt vessel and the As chamber, while establishing a gentle temperature gradient in the passage leading from the GaAs melt vessel to the As chamber. Whereby, a GaAs single crystal having a large diameter and a good crystal perfection with minimized deviation from stoichiometry and minimized lattice dislocation can be obtained.

1 Claim, 1 Drawing Sheet

APPARATUS FOR GROWING A GAAS SINGLE CRYSTAL BY PULLING FROM GAAS MELT

This is a continuation of application Ser. No. 07/624,496, filed Dec. 7, 1990, now abandoned which was a continuation of application Ser. No. 07/288,094 filed Dec. 22, 1988, now abandoned which is a divisional of application Ser. No. 07/080,169 filed Jul. 30, 1987, now abandoned which is a continuation of application Ser. No. 06/780,719 filed Sept. 27, 1985, now abandoned which is a divisional of application Ser. No. 06/511,629 filed Jul. 7, 1983, now abandoned.

BACKGROUND OF THE INVENTION a) Field of the Invention

The present invention relates to an apparatus for growing a GaAs single crystal by pulling up from a melt thereof.

b) Description of the Prior Art

As well known, single crystals of GaAs which is a compound semiconductor are used as the substrates for the fabrication of various semiconductor devices such as light-emitting diodes, laser diodes or microwave diodes, and such crystals are used also as the material for fabricating semiconductor devices such as transistors and semiconductor integrated circuits which are operated at high speeds, in view of the fact that GaAs has an electron mobility of 8500 $cm^2$/V.sec which is more than 5 times greater than that of silicon. As a matter of course, it is desired that GaAs single crystals which are employed as the substrates for the fabrication of those devices as mentioned above have a superior crystal habit. Conventionally, GaAs single crystals have been grown by relying on, for example, horizontal Bridgman method and or the LEC (Liquid Encapsulated Czochralski) method in which the growth zone is sealed off with a $B_2O_3$ capsule. The Bridgman method employs a quartz tube, which leads to such drawbacks that there is a difficulty of obtaining a single crystal of a large diameter, and that, since it has been usual to grow a crystal in the (111) orientation, there is the necessity to cut the crystal obliquely to the (111) orientation instead of normal thereto in order to obtain a substrate having a (100) face which frequently is used in various semiconductor devices, and this necessity results in the lack of uniformity of the impurity concentration in the substrate, and further that although a semi-insulating, i.e. highly resistive, substrate can be obtained usually by doping an impurity such as Cr or O or both, such an impurity requires to be doped at a high temperature of around 800° C. or above, and it cannot be doped with stability. The LEC method, on the other hand, enables one to obtain a crystal of a large diameter in the (100) face, but since it employs a $B_2O_3$ layer as the sealing or encapsulating member, this brings about a large temperature gradient of about 100°~300° C./cm between the GaAs melt and the seed crystal, so that defects such as lattice dislocation tend to be induced during the crystal growth. Besides these conventional methods, there has been practiced such method as Czochralski's pulling method. This latter method, however, has drawbacks similar to those mentioned above. There are further important problems about GaAs crystals, as will be discussed below.

Unlike Si crystals, a GaAs crystal which is a compound semiconductor is made by compounding two elements of Ga and As. In addition, the vapor pressures of the Ga element and of the As element have a great divergence over each other, and the vapor pressure of As is by far the greater than that of the vapor pressure of Ga. Thus, the GaAs crystal which is grown by the conventional methods exhibits a considerably great deviation from stoichiometric composition. In the usual growth process, As atoms tend to present a shortage within the GaAs crystal, leading to the development of defects such as As vacancies or lattice dislocation, or the defect due to combination of As vacancies and the atoms of an impurity. Recent researches have made it clear that a deviation of the crystal being grown from stoichiometric composition most greatly affects the characteristics or the life of the device fabricated by this crystal. The present inventor earlier proposed a method of solving this problem in the technical field of epitaxial growth of compound semicondcutor crystals by supplying the vapor of As during the growth process, with a very high degree of success. In the technical field of producing a single crystal by relying on the pulling method, however, there has not been considered a growth apparatus in which the problem of deviation from stoichiometry is taken into account.

SUMMARY OF THE INVENTION

It is, therefore, the object of the present invention to provide a new apparatus for growing a GaAs single crystal by pulling it up out of a melt thereof which eliminates the drawbacks of the abovesaid conventional methods of growing a GaAs single crystal, and which is capable of producing a large-size GaAs single crystal having a good crystal habit due to minimized deviation from stoichiometric composition.

DETAILED DESCRIPTION OF THE PREFERRED EMBODIMENT

Figure 1:
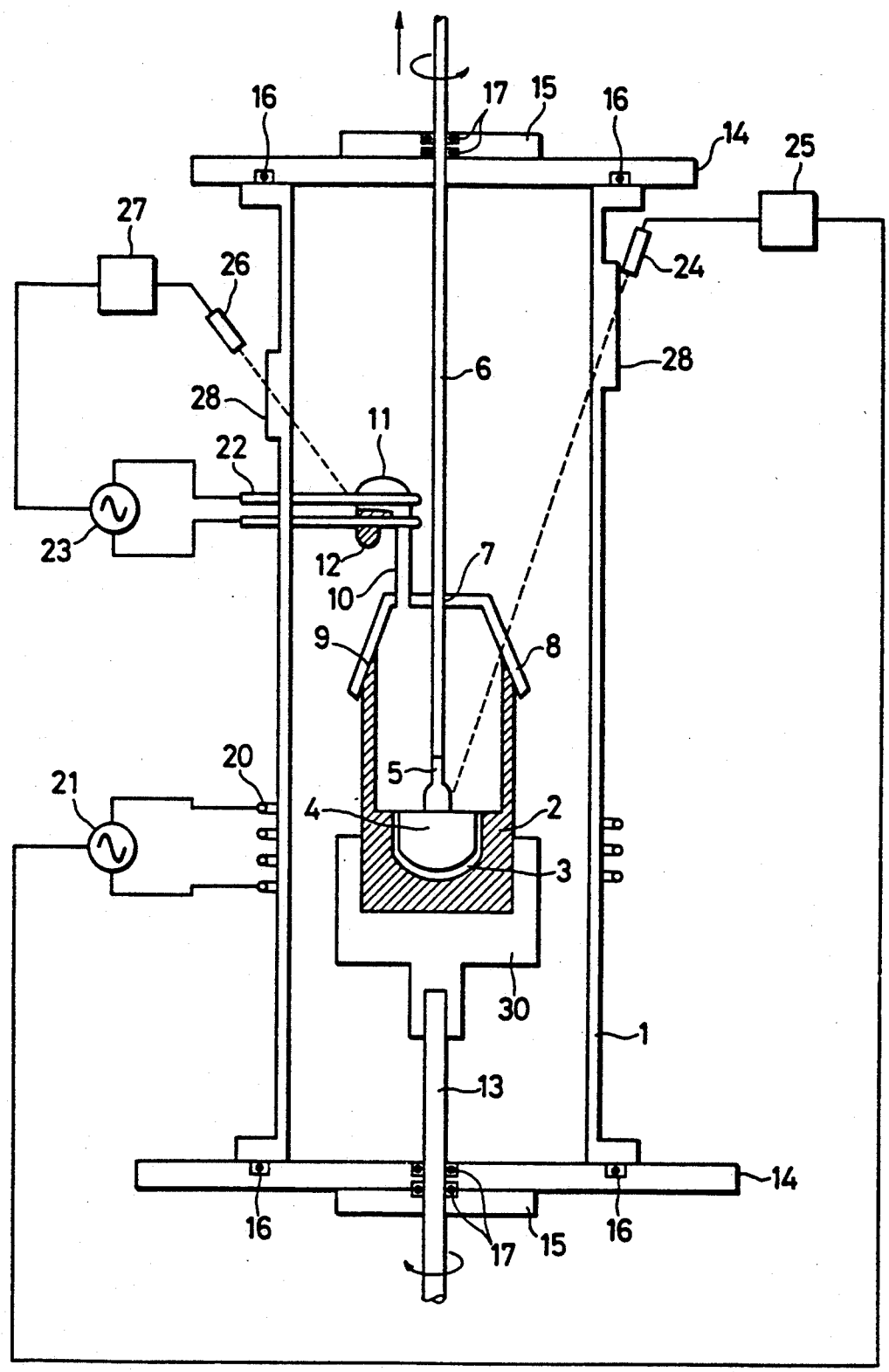
FIG. 1 is a diagrammatic illustration, partly in section, showing an embodiment, according to the present invention, of the apparatus for growing a GaAs single crystal by pulling it out of a melt thereof.

The present invention will hereunder be described in detail with respect to a preferred embodiment in conjunction with the accompanying drawing.

FIG. 1 is an embodiment of the present invention showing the apparatus for growing a GaAs single crystal by pulling it up out of the melt thereof. In this drawing, reference numeral 1 represents a quartz tube; 2 a GaAs melt vessel made of carbon; 3 a crucible made of such material as quartz or pBN (pyrolytic Boron Nitride) for containing GaAs melt 4; 5 a GaAs seed crystal; 6 a pull-up rod to pull up a crystal grown from a seed crystal; 7 a ground-and-fit adjoining sealing portion of the rod 6 and a cover 8 made of quartz or sapphire which will be described later; 8 said cover having a ground-and-fit portion 9 established relative to the wall of said vessel 2 made of carbon, and into said cover opens a narrow tube 10 which has a small diameter and which communicates with a chamber 11 containing As 12; 30 a housing made of such material as $Al_2O_3$ for supporting the vessel 2, and this housing 30 is connected to a rotary rod 13 intended to rotate the crucible 3; 14 and 15 stainless steel plates, respectively, for supporting said quartz tube 1; 16 and 17 sealing members, respectively, such as O-ring or gasket; 20 a radio frequency induction working coil for heating the vessel 2 made of carbon and accordingly the crucible 3; 21 a power supply such as radio frequency oscillator; 22 a radio frequency induction working coil for heating the chamber 11 containing As 12 and connected to the power supply 23 such as a radio frequency oscillator; 24 a thermometer for measuring the temperature at the interface between the seed crystal 5 and the melt 4; 26 a thermometer for measuring the temperature of As 12 which is supplied into the carbon-made vessel 2; 25 and 27 temperature-adjusting members, respectively, for controlling the electric power of the power supplies 21 and 23, respectively; and 28 a window for observation and the measurement of temperature of the seed crystal 5, the melt 4 and As 12.

The grown crystal is pulled up from the melt in the following manner. The GaAs melt 4 is heated to about 1240° C which is close to the melting point of GaAs by radio frequency induction to render it to the melted state. After the temperature of the melt 4 has become constant and stable, the seed crystal 5 secured to the tip of the pull-up rod 6 is brought into contact with the melt 4. After the seed crystal has effected an appropriate necking with the melt 4, the seed crystal 5 which is attached to the tip of the pull-up rod 6 is pulled upwardly while gently rotating the rod, so that a single crystal is grown progressively at the tip of the seed crystal. The temperature of the As chamber 11 is set constant to insure that an optimum vapor pressure $P_{opt}$ of As is supplied to the surface of the melt 4 throughout the single crystal growth process. This supply of As vapor is an indispensable requirement of the present invention.

The optimum vapor pressure of As is approximately given by: $P_{opt} \approx 2.6 \times 10^6 (-1.05eV/kT)(Torr)$. Therefore, when the temperature of the GaAs is assumed to be 1230° C., its $P_{opt}$ may be regarded as being about 820 Torr.

The As temperature $T_{As}$ is given, if the diameter of the narrow tube 10 connecting the As chamber and the carbon-made vessel 2 is small, by the following formula:

$$\sqrt{T_{As}/T_{GaAs}} = P_{As}/P_{GaAs}$$

wherein $P_{As}$ and $T_{As}$ represent the vapor pressure and the temperature of As gas in the As chamber 11, respectively;

$T_{GaAs}$ represents the temperature of the GaAs melt; and $P_{GaAs}$ represents the vapor pressure of As vaporizing from the GaAs melt, and assumes a value close to $P_{opt}$.

Accordingly, if $T_{GaAs}$ is assumed to be 1240° C., and $P_{GaAs}$ is assumed to be 820 Torr, it is only necessary to determine the values of $T_{As}$ and $P_{As}$ so as to be $$\sqrt{T_{As}}/P_{As} = \sqrt{T_{GaAs}}/P_{GaAs} = 0.0474.$$

Since $P_{As}$ is determined by the value of $T_{As}$, it is only necessary to set the temperature $T_{As}$. In order to secure stoichiometric perfection of the GaAs single crystal which is grown, it is necessary to effect a strict controlling of the deviation from stoichiometry, i.e. to control the deviation at a value ±0.1° C. or lower.

What is also important is the temperature gradient across the As-containing region 11 and the melt region 4. It is necessary to arrange so that this temperature gradient is gentle with a continuous temperature distribution, and to arrange especially the temperature gradient in the region close to the interface between the melt 4 and the solid state grown crystal so as to be gentle not to admit the inducement therein of any lattice dislocation. Realization of the temperature distribution of the melt region, the As region and their intermediate regions, may employ not only the RF induction heating as shown in the embodiment, but also any conventional heating method such as resistance heating. The temperature in the region leading from the carbon-made vessel 2 to the As chamber 11 desirably is arranged to be constantly higher than the temperature of the As 12 itself to avoid the deposition of As on to, for example, the quartz container 8.

The sealed site 9 between the carbon-made vessel 2 and the cover 8 made of quartz or sapphire, and the sealed site 7 between the pull-up rod 6 and said cover 8 both require to provide a ground-and-fit sealing of a high precision relative to each other to provide a good sealing therebetween so as to inhibit the leak of the vapor of As 12 applied to the crystal pull-up region defined between the wall of the carbon vessel 2 and the cover 8, as well as the leak of As vapor from the GaAs melt region, and also the leak of the As vapor from the pulled-up GaAs crystal.

In order to obtain, by the pull-up method, a GaAs single crystal having a high crystal perfection, sufficient consideration has to be given to making a precise control of the As vapor pressure which is applied, precise temperature control of not only the regions including the GaAs melt region, but also the pull-up speed, as well as the rotation speeds of the crystal and the crucible.

The controlling of the crystal which has been pulled up from the melt need only be performed while watching, through the window 28, the condition of pulling. By making a good control of the pull-up speed as well as the rotation speed of both the crystal and the crucible, it is easy to obtain a single crystal having a large diameter. In order to perform automatic controlling, it will be needless to say that a weight detector is operatively connected to the pull-up rod 6 to detect the weight of the crystal being pulled up, and to make an automatic control of the respective parameters such as the pull-up speed and the rotation speeds of the crystal as well as the crucible, all of which constitute the growth conditions.

The crucible 3 and other members of the apparatus ought to be made of sufficiently pure materials so as not to allow a dissolution of atoms of unnecessary impurities to migrate into the melt and the crystal.

In order to obtain, by the pull-up method, a GaAs single crystal having a perfect stoichiometric composition, it is necessary to make a strict control of the temperatures of the GaAs melt 4, the As 11 and the passage connecting them. The heating of the crucible may be effected not only by the use of such carbon vessel as shown in the embodiment, but also by the use of, for example, a heating pipe constituted by a metal which is in the liquid condition, or by the use of both.

The vapor pressure of As 11 for obtaining a GaAs single crystal having a good stoichiometric composition is close to the atmospheric pressure as stated above. Accordingly, in the crystal pulling-up apparatus mentioned as an embodiment, it is not very difficult to seal off the growth region. It is needless to say that, in order to prevent possible leak of As vapor to the outside of the system, the pull-up apparatus as a whole may have a pressure-resistant vessel structure. In case a pressure-resistant vessel is used, it is possible to use an inert gas such as nitrogen, argon or helium, or a mixed gas of such inert gas and As vapor, to apply a pressure into the vessel.

As stated above, the apparatus for growing a GaAs single crystal by pulling it up from a melt thereof according to the present invention enables the crystal to be pulled up while applying an optimum As vapor pressure to the GaAs melt in order to give a satisfactory stoichiometric composition of the crystal being grown. Thus, this apparatus provides a crytal having a perfect stoichiometry. Accordingly, it is possible to obtain a GaAs single crystal having a large diameter and having minimized deviation from stoichiometry and minimized lattice dislocation. Thus, the present invention has a very high industrial value.

What is claimed is:

1. An apparatus for growing GaAs single crystals using the Czochralski method, said apparatus comprising:

a closed graphite vessel containing therein a crucible charged with a GaAs melt and adjacently located a GaAs single seed crystal, said vessel having a rotary mechanism, said graphite vessel being designed so as to surround the grown GaAs single crystals, said graphite vessel being closed by a cover formed of quartz, said cover being in ground-and-fit contact with the graphite vessel, wherein said crucible is formed of one of quartz and pyrolytic boron nitride.

an As chamber charged with As and coupled with said closed graphite vessel via a narrow passage, with said closed vessel to supply As vapor into said closed vessel, wherein said As chamber is thermally isolated from said closed vessel, said narrow passage being disposed so that said passage is not proximate the melt.

first heating means arranged around said closed vessel to heat said closed vessel, first temperature measuring means arranged in association with said GaAs melt to measure the temperature of said GaAs melt, a first temperature controller connected to said first temperature measuring means and said first heating means to keep said GaAs melt at a temperature set at or just above the melting point of GaAs, second heating means arranged around said As chamber to supply sufficient heat to said As chamber and narrow passage to prevent As vapor from depositing on the inside of said closed vessel, second temperature measuring means arranged in association with said As chamber to measure the temperature of As in said As chamber, a second temperature controller connected to said second temperature measuring means and second heating means to keep said As chamber at a substantially constant temperature sufficient to impart to a GaAs single crystal, having a fixed crystal temperature, being grown and onto said GaAs melt an optimum As vapor pressure without the use of any encapsulant so as to cause said GaAs single crystal to be at least substantially devoid of deviation from stoichiometric composition, said As vapor pressure controlled to be constant, third heating means to heat the interior of said closed vessel in cooperation with said first heating means to provide a gradual temperature gradient at said narrow passage in order to prevent said As vapor from depositing on the inside of said closed vessel, means for supporting said crucible connected to said vessel and adapted to rotate said crucible, said supporting means being thermally isolated from an environment surrounding said apparatus and providing support for said graphite vessel.

* * * * *